(12) United States Patent
Sakurai et al.

(10) Patent No.: US 11,955,352 B2
(45) Date of Patent: Apr. 9, 2024

(54) SUBSTRATE PROCESSING APPARATUS

(71) Applicant: Tokyo Electron Limited, Tokyo (JP)

(72) Inventors: Hiroki Sakurai, Koshi (JP); Daisuke Goto, Koshi (JP); Takashi Nakazawa, Koshi (JP); Yusuke Takamatsu, Koshi (JP); Yusuke Hashimoto, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 366 days.

(21) Appl. No.: 17/141,670

(22) Filed: Jan. 5, 2021

(65) Prior Publication Data

US 2021/0210363 A1 Jul. 8, 2021

(30) Foreign Application Priority Data

Jan. 7, 2020 (JP) .................................. 2020-000926

(51) Int. Cl.
*H01L 21/67* (2006.01)
*H01L 21/687* (2006.01)

(52) U.S. Cl.
CPC .... *H01L 21/67051* (2013.01); *H01L 21/6708* (2013.01); *H01L 21/68764* (2013.01)

(58) Field of Classification Search
CPC .... H01L 21/6708; B01F 25/31; B01F 25/313; B01F 25/3133; B01F 25/314; B01F 25/3142; B01F 23/451; F16L 41/021; F16L 43/005

See application file for complete search history.

(56) References Cited

U.S. PATENT DOCUMENTS

| 7,427,333 B2* | 9/2008 | Wada ...................... G03F 7/423 156/345.21 |
| 2006/0081180 A1* | 4/2006 | Aoki ................... H01L 21/6715 118/313 |
| 2012/0074102 A1* | 3/2012 | Magara ............... H01L 21/6708 156/345.23 |

(Continued)

FOREIGN PATENT DOCUMENTS

| JP | 2008183550 A | 8/2008 |
| JP | 2008-285508 A | 11/2008 |

(Continued)

*Primary Examiner* — Keath T Chen
*Assistant Examiner* — Margaret Klunk
(74) *Attorney, Agent, or Firm* — Nath, Goldberg & Meyer; Jerald L. Meyer; Tanya E. Harkins

(57) ABSTRACT

A substrate processing apparatus includes: a temperature raising part for raising a temperature of a first sulfuric acid; a mixing part for mixing the first sulfuric acid where the temperature is raised by the temperature raising part with a moisture-containing liquid to generate a mixed solution; and a discharging part for discharging the mixed solution onto a substrate inside a substrate processing part. The mixing part includes: a joining portion where a sulfuric acid supply line through which the first sulfuric acid where the temperature is raised by the temperature raising part flows and a liquid supply line through which the first sulfuric acid where the temperature is raised by the temperature raising part and the moisture-containing liquid flows are joined; and a reaction suppression mechanism for suppressing a reaction between the first sulfuric acid and the moisture-containing liquid in the joining portion.

6 Claims, 12 Drawing Sheets

(56) References Cited

U.S. PATENT DOCUMENTS

2013/0319465 A1*  12/2013  Brown .................. B01F 23/451
                                                            134/115 R
2017/0162400 A1*  6/2017  Iwata ...................... B08B 3/041

FOREIGN PATENT DOCUMENTS

| JP | 2015159331 A | 9/2015 |
| JP | 2019057677 A | 4/2019 |
| WO | 2019239970 | 12/2019 |

* cited by examiner

SUBSTRATE PROCESSING APPARATUS

CROSS-REFERENCE TO RELATED APPLICATION

This application is based upon and claims the benefit of priority from Japanese Patent Application No. 2020-000926, filed on Jan. 7, 2020, the entire contents of which are incorporated herein by reference.

TECHNICAL FIELD

The present disclosure relates to a substrate processing apparatus.

BACKGROUND

In the related art, in a case in which two kinds of materials (for example, a wiring material and a diffusion prevention film) are contained in a film formed on a substrate such as a semiconductor wafer (hereinafter, also referred to as a "wafer") or the like, a technique of selectively etching one of the materials is known (see Patent Document 1).

PRIOR ART DOCUMENTS

Patent Documents

Patent Document 1: Japanese laid-open publication No. 2008-285508

SUMMARY

According to one embodiment of the present disclosure, there is provided a substrate processing apparatus includes: a temperature raising part configured to raise a temperature of a first sulfuric acid; a mixing part configured to mix the first sulfuric acid where the temperature is raised by the temperature raising part with a moisture-containing liquid to generate a mixed solution; and a discharging part configured to discharge the mixed solution onto a substrate inside a substrate processing part, wherein the mixing part includes: a joining portion where a sulfuric acid supply line through which the first sulfuric acid where the temperature is raised by the temperature raising part flows and a liquid supply line through which the first sulfuric acid where the temperature is raised by the temperature raising part and the moisture-containing liquid flows are joined; and a reaction suppression mechanism configured to suppress a reaction between the first sulfuric acid where the temperature is raised by the temperature raising part and the moisture-containing liquid in the joining portion.

BRIEF DESCRIPTION OF DRAWINGS

The accompanying drawings, which are incorporated in and constitute a part of the specification, illustrate embodiments of the present disclosure, and together with the general description given above and the detailed description of the present embodiments given below, serve to explain the principles of the present disclosure.

DETAILED DESCRIPTION

An embodiment of a substrate processing apparatus disclosed in the present disclosure will now be described in detail with reference to the accompanying drawings. Further, the present disclosure is not limited to embodiments described below. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In addition, it should be noted that the drawings are schematic, and the relationships between dimensions of respective elements, the ratios of the respective elements, and the like may differ from reality. Also, there may be a case where the relationship of dimensions and the ratios differ from each other between the drawings.

In the related art, in a case in which two kinds of materials (for example, a wiring material and a diffusion prevention film) are contained in a film formed on a substrate such as a semiconductor wafer (hereinafter, also referred to as a wafer) or the like, a technique of selectively etching one of the materials is known. In order to etch one of the materials with high selectivity, there is a case in which a mixed solution obtained by mixing plural types of materials including temperature-raised sulfuric acid and the like is used as an etching liquid.

On the other hand, when a chemical liquid such as the sulfuric acid is mixed in a pipe to generate a mixed solution, the chemical liquid may react in a mixing part so that the temperature thereof is raised to a boiling point, and the mixed solution may be suddenly boiled. Therefore, when the discharge of the mixed solution is stopped and an etching process is completed, the chemical liquid in the pipe vibrates due to the sudden boiling. Thus, the chemical liquid (e.g., the sulfuric acid) has to be continuously discharged until the sudden boiling reaction in the mixing part stops.

That is, in the conventional technique, even after the etching process using the mixed solution M is completed, it is necessary to perform a process of discharging a chemical liquid such as the sulfuric acid or the like until the sudden boiling stops. Therefore, it is likely that the entire process time becomes long and the consumption amount of the chemical liquid increases.

Therefore, there is an expectation of a technique capable of overcoming the above-mentioned problems and suppressing the occurrence of the sudden boiling reaction in the mixing part when the etching process using the mixed solution is completed.

<Outline of the Substrate Processing System>

Figure 1:
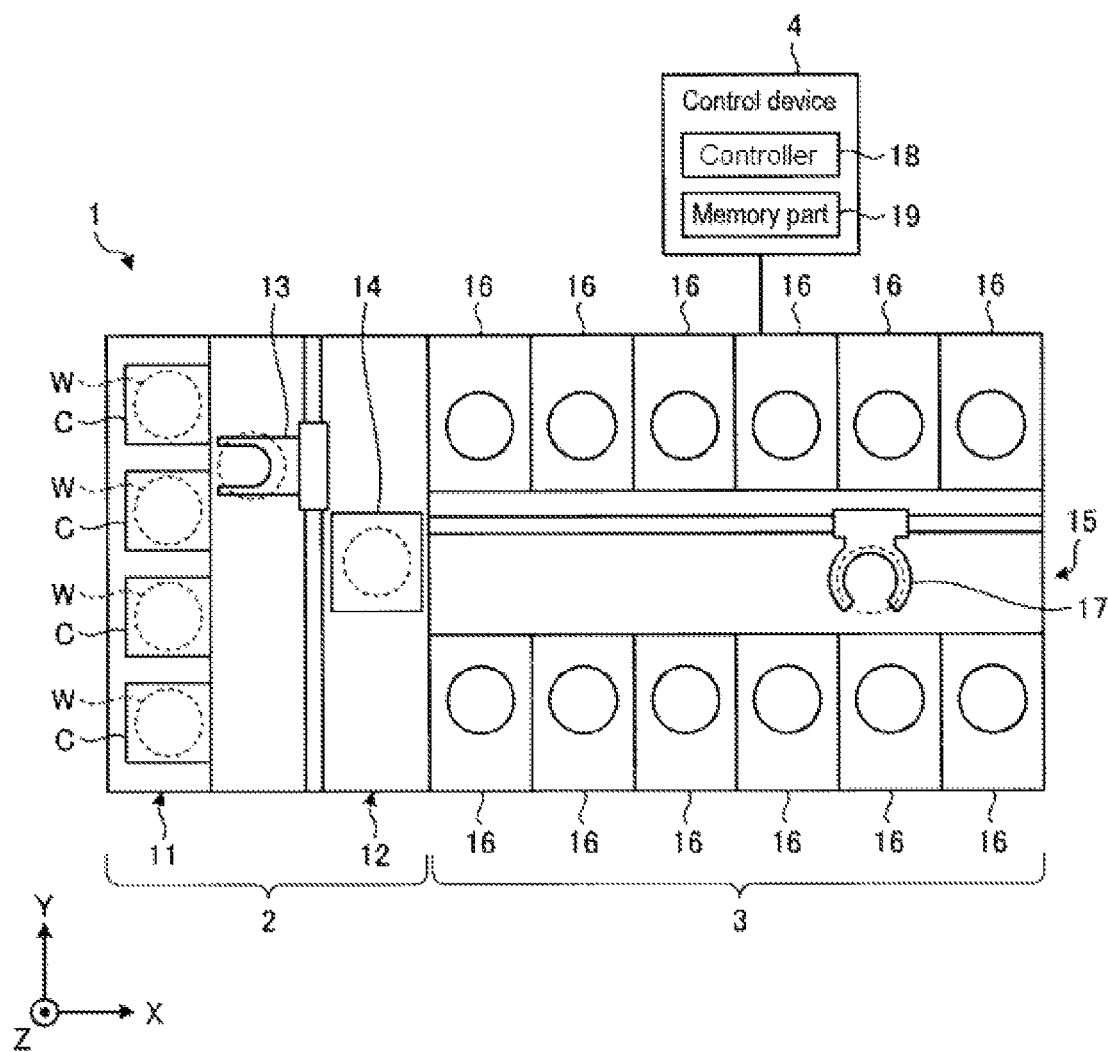
FIG. 1 is a schematic view showing a schematic configuration of a substrate processing system according to an embodiment.

First, a schematic configuration of a substrate processing system 1 according to an embodiment of the present disclosure will be described with reference to FIG. 1. FIG. 1 is a diagram illustrating the schematic configuration of the substrate processing system 1 according to an embodiment of the present disclosure. The substrate processing system 1 is an example of a substrate processing apparatus. In the following description, in order to clarify the positional relationship, an X-axis, a Y-axis, and a Z-axis orthogonal to each another are defined, and the positive direction of the Z-axis is defined as a vertical upward direction.

As illustrated in FIG. 1, the substrate processing system 1 includes a loading/unloading station 2 and a processing station 3. The loading/unloading station 2 and the processing station 3 are provided adjacent to each other.

The loading/unloading station 2 includes a carrier placement part 11 and a transfer part 12. A plurality of carriers C for accommodating a plurality of substrates (in the present embodiment, semiconductor wafers W (hereinafter, referred to as wafers W)) in a horizontal posture are placed on the carrier placement part 11.

The transfer part 12 is provided adjacent to the carrier placement part 11, and includes a substrate transfer device 13 and a delivery part 14 provided therein. The substrate transfer device 13 includes a wafer holding mechanism for holding the wafer W. Furthermore, the substrate transfer device 13 can horizontally and vertically move and rotate around a vertical axis thereof, and transfers the wafer W between the carriers C and the delivery part 14 using the wafer holding mechanism.

The processing station 3 is provided adjacent to the transfer part 12. The processing station 3 includes a transfer part 15 and a plurality of processing units 16. The plurality of processing units 16 are provided to be arranged on both sides of the transfer part 15.

The transfer part 15 includes a substrate transfer device 17 provided therein. The substrate transfer device 17 includes a wafer holding mechanism for holding the wafer W. Also, the substrate transfer device 17 can horizontally and vertically move and rotate around a vertical axis thereof, and transfers the wafer W between the delivery part 14 and the processing units 16 using the wafer holding mechanism.

Each of the processing units 16 performs a predetermined substrate processing on the wafer W transferred by the substrate transfer device 17.

In addition, the substrate processing system 1 includes a control device 4. The control device 4 is, for example, a computer, and includes a controller 18 and a storage part 19. A program for controlling various processes performed by the substrate processing system 1 is stored in the storage part 19. The controller 18 controls the operation of the substrate processing system 1 by reading the program stored in the storage part 19 and executing the same.

The program has been stored in a non-transitory computer-readable storage medium, and may be installed on the storage part 19 of the control device 4 from the storage medium. The computer-readable storage medium includes, for example, a hard disk (HD), a flexible disk (FD), a compact disc (CD), a magneto-optical disc (MO), and a memory card, and the like.

In the substrate processing system 1 configured as described above, first, the substrate transfer device 13 of the loading/unloading station 2 picks up the wafer W from any of the carriers C placed on the carrier placement part 11, and places the same on the delivery part 14. The wafer W placed on the delivery part 14 is picked up from the delivery part 14 by the substrate transfer device 17 of the processing station 3 and loaded into any of the processing units 16.

The wafer W loaded into the processing unit 16 is processed by the processing unit 16, and then unloaded from the processing unit 16 by the substrate transfer device 17 and placed on the delivery part 14. Then, the processed wafer W placed on the delivery part 14 is returned to the carrier C of the carrier placement part 11 by the substrate transfer device 13.

<Configuration of the Processing Unit>

Figure 2:
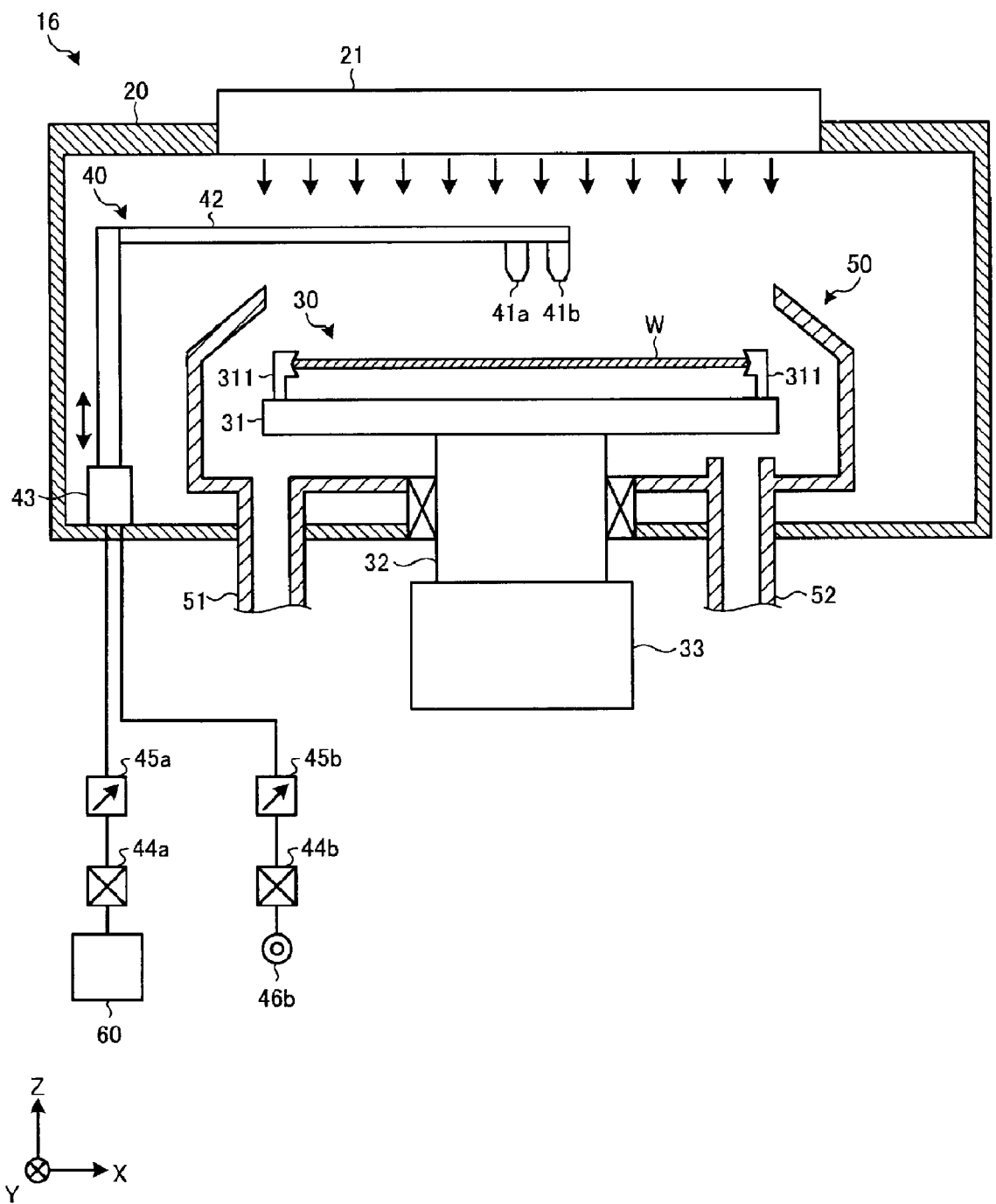
FIG. 2 is a schematic view showing a specific configuration example of a processing unit.

Next, a configuration of the processing unit 16 will be described with reference to FIG. 2. FIG. 2 is a schematic view illustrating a specific configuration example of the processing unit 16. As illustrated in FIG. 2, the processing unit 16 includes a chamber 20, a substrate processing part 30, a liquid supply part 40, and a recovery cup 50.

The chamber 20 accommodates the substrate processing part 30, the liquid supply part 40, and the recovery cup 50. A fan filter unit (FFU) 21 is provided on a ceiling of the chamber 20. The FFU 21 forms a down-flow inside the chamber 20.

The substrate processing part 30 includes a holder 31, a pillar 32 and a driver 33, and performs liquid processing on the placed wafer W. The holder 31 horizontally holds the wafer W. The pillar 32 is a member extending in the vertical direction, and includes a base end portion rotatably supported by the driver 33 and a leading end portion that horizontally supports the holder 31. The driver 33 rotates the pillar 32 around the vertical axis.

The substrate processing part 30 rotates the holder 31 supported by the pillar 32 by rotating the pillar 32 using the driver 33, so as to rotate the wafer W held by the holder 31.

A holding member 311 for holding the wafer W from the side surface of the wafer W is provided on an upper surface of the holder 31 included in the substrate processing part 30. The wafer W is horizontally held by the holding member 311 in a state slightly separated from the upper surface of the holder 31. Furthermore, the wafer W is held by the holder 31, in a state in which a surface of the wafer W on which the substrate processing is to be performed is oriented upward.

The liquid supply part 40 supplies a processing fluid to the wafer W. The liquid supply part 40 includes a plurality of (two in this case) nozzles 41a and 41b, an arm 42 for horizontally supporting the nozzles 41a and 41b, and a rotating/elevating mechanism 43 for rotating and elevating the arm 42.

The nozzle 41a is an example of a discharge part and is connected to a mixed-solution supply part 60 via a valve 44a and a flow rate regulator 45a. Details of the mixed-solution supply part 60 will be described later.

The nozzle 41b is connected to a deionized water (DIW) source 46b via a valve 44b and a flow rate regulator 45b. The DIW is used for, for example, a rinsing process. A processing liquid used for the rinsing process is not limited to the DIW.

A mixed solution M (see FIGS. 3A to 3C) supplied from the mixed-solution supply part 60 is discharged from the nozzle 41a. Details of the mixed solution M will be described later. The DIW supplied from the DIW source 46b is discharged from the nozzle 41b.

The recovery cup 50 is arranged so as to surround the holder 31, and collects the processing liquid scattered from the wafer W with the rotation of the holder 31. A drainage port 51 is formed at the bottom of the recovery cup 50 so that the processing liquid collected by the recovery cup 50 is discharged from the drainage port 51 to the outside of the processing unit 16. In addition, an exhaust port 52 for discharging a gas supplied from the FFU 21 to the outside of the processing unit 16 is formed at the bottom of the recovery cup 50.

Furthermore, although there is illustrated an example in which two nozzles are provided in the processing unit 16 of the present embodiment, the number of nozzles provided in the processing unit 16 is not limited to two. For example, an isopropyl alcohol (IPA) source for supplying IPA and a third nozzle connected to the IPA source may be provided so that the IPA is discharged from the third nozzle.

<Details of the Cleaning Process>

Figure 3A:
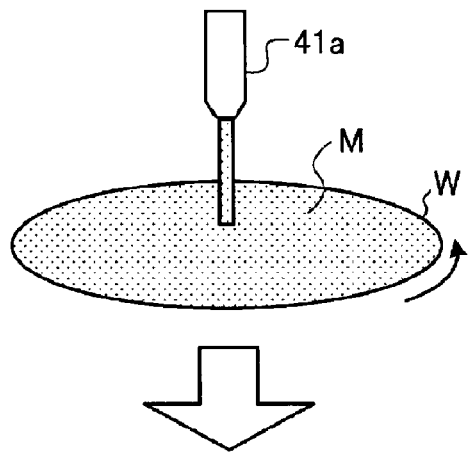
FIGS. 3A to 3C are views showing an outline of an etching process according to an embodiment.
Figure 3B:
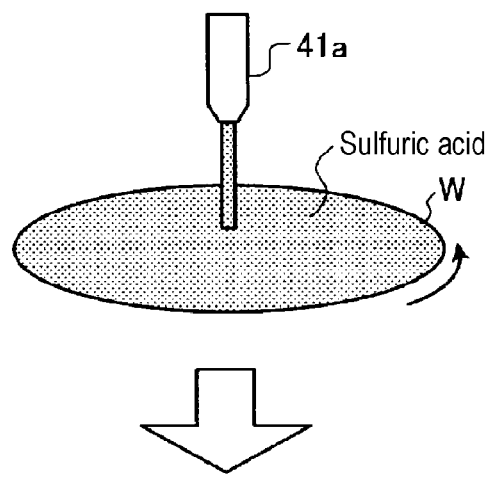
Figure 3C:
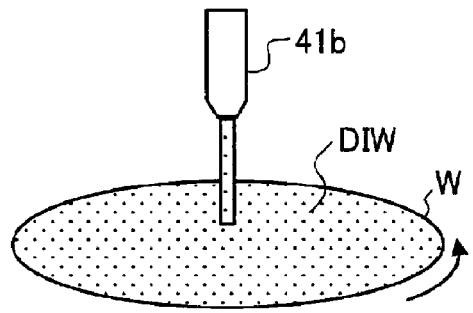

Next, details of the etching process of the wafer W in the processing unit 16 will be described with reference to FIGS. 3A to 3C. FIGS. 3A to 3C are diagrams illustrating an outline of the etching process in the present embodiment. Further, it is assumed that tungsten (W) and titanium nitride (TiN) of different materials are contained in a film formed on the surface of the wafer W on which the etching process is to be performed.

First, the wafer W is loaded into the chamber 20 of the processing unit 16 by the substrate transfer device 17. Then, the wafer W is held by the holding member 311 of the substrate processing part 30 with the surface to be subjected to the substrate processing oriented upward. Thereafter, the holding member 311 rotates with the wafer W at a predetermined rotational speed by the driver 33.

Next, as illustrated in FIG. 3A, the etching process by the mixed solution M is performed in the processing unit 16. In this etching process, the nozzle 41a of the liquid supply part 40 moves to above the center of the wafer W.

Thereafter, as the valve 44a is opened for a predetermined time, the mixed solution M containing concentrated sulfuric acid is supplied to the surface of the wafer W.

In this embodiment, the mixed solution M whose temperature has been raised to a predetermined temperature or higher is supplied to the wafer W. As a result, the reactions of the following formulae (1) and (2) occur in the mixed solution M.

$$2H_2SO_4 \rightarrow H_3SO_{4+} + HSO_{4-} \quad (1)$$

$$H_3SO_{4+} \rightarrow H_+ + H_2SO_4 \quad (2)$$

Then, $H_+$ generated by the above reaction selectively reacts with titanium nitride among tungsten and titanium nitride contained in the film formed on the surface of the wafer W as represented by the following formula (3).

$$TiN + 4H_+ \rightarrow Ti_{3+} + NH_{4+} \quad (3)$$

Since $Ti_{3+}$ generated by the reaction of the formula (3) is dissolved in the mixed solution M, the mixed solution M can selectively etch the titanium nitride based on the reactions of the above formulae (1) to (3). Therefore, according to the present embodiment, among the tungsten and the titanium nitride contained in the film formed on the surface of the wafer W, the titanium nitride can be etched with high selectivity.

Further, in the present embodiment, it is preferable to perform the etching process with the mixed solution M obtained by adding pure water to the concentrated sulfuric acid. As a result, in addition to the reactions of the above formulae (1) and (2), the reactions of the following formulae (4) and (5) occur in the mixed solution M.

$$H_2O + H_2SO_4 \rightarrow H_3O_+ + HSO_{4-} \quad (4)$$

$$H_3O_+ \rightarrow H_+ + H_2O \quad (5)$$

By the reactions of the formulas (4) and (5), a larger amount of $H_+$ is supplied into the mixed solution M. As a result, in the present embodiment, the reaction of the above formula (3) is promoted, whereby the mixed solution M can more selectively etch the titanium nitride.

The following is a description of FIGS. 3A to 3C. In the processing unit 16, as shown in FIG. 3B, a process of discharging the sulfuric acid from the nozzle 41a is performed. This process is executed for the following reason. When stopping the discharge of the mixed solution M from the nozzle 41a, if the supply of the sulfuric acid and the supply of the DIW is stopped at the same time, the sulfuric acid and the DIW is suddenly boiled in the pipe. This makes it difficult to perform a good liquid drainage process in the nozzle 41a.

Specifically, by discharging only the sulfuric acid from the nozzle 41a until the sudden boiling reaction between the sulfuric acid and the DIW in the mixing part 140 (see FIG. 4) is settled, it is possible to execute the liquid drainage process without any problem when the liquid drainage process is subsequently executed in the nozzle 41a.

In the sulfuric acid discharging process shown in FIG. 3B, the sulfuric acid does not react with the DIW in the mixing part 140. Therefore, the temperature of the sulfuric acid is lower than that of the mixed solution M, and the reactions of the above formulae (4) and (5) do not occur. That is, the sulfuric acid discharging process hardly contributes to the etching process of the wafer W. The details of the sulfuric acid discharging process will be described later.

Subsequently, in the processing unit 16, as shown in FIG. 3C, a rinsing process using the DIW is performed. In the rinsing process, the nozzle 41b of the liquid supply part 40 moves to above the center of the wafer W, and the valve 44b is opened for a predetermined time, whereby the DIW having room temperature, which is a rinsing liquid, is supplied to the surface of the wafer W.

By the rinsing process, it is possible to remove residues such as the mixed solution M, the etched titanium nitride and the like remaining on the wafer W. The temperature of the DIW in the rinsing process may be room temperature or a temperature higher than the room temperature.

Subsequently, in the processing unit 16, a drying process of drying the wafer W is performed. In the drying process, for example, the holding member 311 is rotated at a high speed by the driving part 33 so as to drop down the DIW on the wafer W held by the holding member 311. Instead of dropping down the DIW, the DIW may be replaced by IPA, and then the IPA may be dropped down to dry the wafer W.

Thereafter, an unloading process is performed in the processing unit 16. In the unloading process, after the rotation of the wafer W is stopped, the wafer W is unloaded from the processing unit 16 by the substrate transfer device 17. When the unloading process is completed, a series of etching processes for one sheet of wafer W ends.

<Configuration of Mixed-Solution Supply Part>

Figure 4:
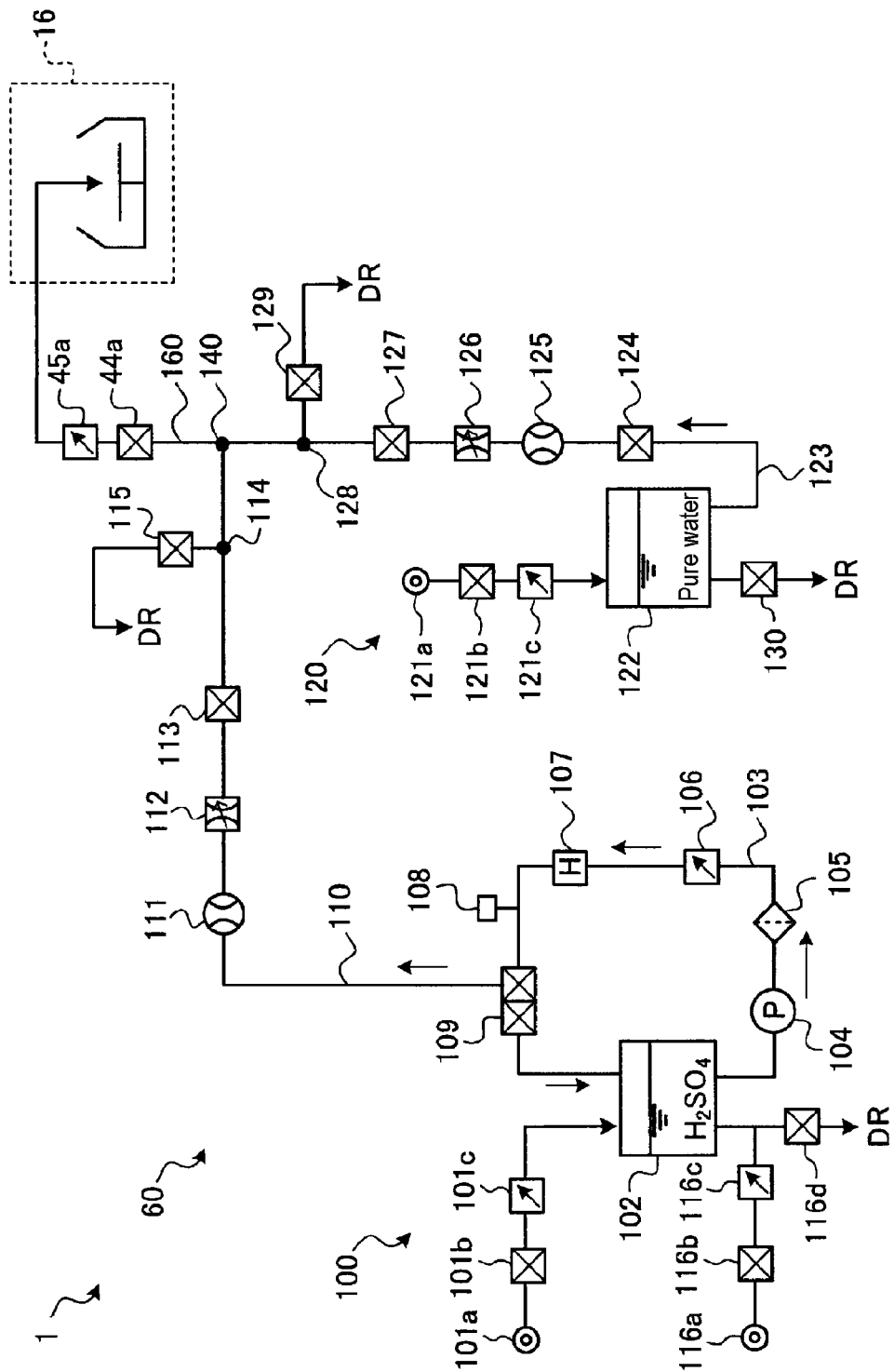
FIG. 4 is a view showing a configuration of a mixed-solution supply part according to an embodiment.

Next, a configuration of the mixed-solution supply part 60 included in the substrate processing system 1 will be described with reference to FIG. 4. FIG. 4 is a view showing the configuration of the mixed-solution supply part 60 according to the present embodiment. Each part of the mixed-solution supply part 60 described below can be controlled by the controller 18.

As shown in FIG. 4, the mixed-solution supply part 60 according to the present embodiment includes a sulfuric acid supply part 100, a pure water supply part 120 and a mixing part 140.

The sulfuric acid supply part 100 supplies the sulfuric acid to the mixing part 140. The sulfuric acid is, for example, a concentrated sulfuric acid. The sulfuric acid supply part 100 includes a sulfuric acid source 101a, a valve 101b, a flow rate regulator 101c, a tank 102, a circulation line 103 and a sulfuric acid supply line 110.

The sulfuric acid source 101a is connected to the tank 102 via the valve 101b and the flow rate regulator 101c. As a result, the sulfuric acid source 101a can supply the sulfuric acid to the tank 102 via the valve 101b and the flow rate regulator 101c, and can store the sulfuric acid in the tank 102.

The circulation line 103 is a circulation line that starts from the tank 102 and returns to the tank 102. In the circulation line 103, a pump 104, a filter 105, a flow rate regulator 106, a heater 107, a thermocouple 108 and a switching part 109 are provided sequentially from the upstream side with the tank 102 as a reference. The heater 107 is an example of a temperature raising part.

The pump 104 forms a sulfuric acid circulation flow that starts from the tank 102, passes through the circulation line 103 and returns to the tank 102. The filter 105 removes contaminants such as particles and the like contained in the sulfuric acid circulating in the circulation line 103. The flow rate regulator 106 regulates a flow rate of the sulfuric acid circulation flow passing through the circulation line 103.

The heater 107 heats the sulfuric acid circulating in the circulation line 103. The thermocouple 108 measures a temperature of the sulfuric acid circulating in the circulation line 103. Therefore, the controller 18 can control the temperature of the sulfuric acid circulating in the circulation line 103 by using the heater 107 and the thermocouple 108.

The switching part 109 is connected to the mixing part 140 of the mixed-solution supply part 60 via the sulfuric acid supply line 110, and can switch the destination of the sulfuric acid circulating in the circulation line 103 to the tank 102 or the mixing part 140.

In the sulfuric acid supply line 110, a flowmeter 111, a power-operated needle valve 112, a valve 113 and a branch portion 114 are provided sequentially from the upstream side with the switching part 109 as a reference.

The flowmeter 111 measures the flow rate of the sulfuric acid flowing through the sulfuric acid supply line 110. The needle valve 112 regulates the flow rate of the sulfuric acid flowing through the sulfuric acid supply line 110. The branch portion 114 is connected to a drain portion DR via a valve 115.

The controller 18 can supply the sulfuric acid to the mixing part 140 at an accurate flow rate by feedback-controlling the needle valve 112 using a value measured by the flowmeter 111.

Further, a pure water source 116a, a valve 116b, a flow rate regulator 116c and a valve 116d are provided in the tank 102. The tank 102 is connected to the drain portion DR via a valve 116d. The pure water source 116a is connected a node between the tank 102 and the valve 116d via a valve 116b and the flow rate regulator 116c.

With this configuration, the controller 18 can control the valve 116b, the flow rate regulator 116c and the valve 116d to discharge the sulfuric acid to the drain portion DR after diluting the concentrated sulfuric acid stored in the tank 102 to a predetermined concentration when replacing the sulfuric acid stored in the tank 102.

The pure water supply part 120 supplies the DIW to the mixing part 140. The DIW is an example of the pure water and also an example of a moisture-containing liquid. The pure water supply part 120 includes a pure water source 121a, a valve 121b, a flow rate regulator 121c, a tank 122 and a pure water supply line 123. The pure water supply line 123 is an example of a liquid supply line.

The pure water source 121a is connected to the tank 122 via the valve 121b and the flow rate regulator 121c. Thus, the pure water source 121a can supply the pure water to the tank 122 via the valve 121b and the flow rate regulator 121c, and can store the pure water in the tank 122.

In the pure water supply line 123, a valve 124, a flowmeter 125, a power-operated needle valve 126, a valve 127 and a branch portion 128 are provided sequentially from the upstream side with the tank 122 as a reference.

The flowmeter 125 measures a flow rate of the pure water flowing through the pure water supply line 123. The needle valve 126 regulates the flow rate of the pure water flowing through the pure water supply line 123. The branch portion 128 is connected to the drain portion DR via a valve 129.

The controller 18 can supply the pure water to the mixing part 140 at an accurate flow rate by feedback-controlling the needle valve 126 using a value measured by the flowmeter 125.

Further, the tank 122 is connected to the drain portion DR via a valve 130. Thus, when replacing the pure water stored in the tank 122, the controller 18 can control the valve 130 to discharge the pure water stored in the tank 122 to the drain portion DR.

The mixing part 140 mixes the sulfuric acid supplied from the sulfuric acid supply part 100 and the pure water supplied from the pure water supply part 120 to generate the mixed solution M (see FIGS. 3A to 3C). In the present embodiment, the mixing part 140 is provided at a location where the sulfuric acid supply line 110 and the pure water supply line 123 are joined.

The mixing part 140 is connected to the processing unit 16 via a mixed-solution supply line 160. Further, the valve 44a and the flow rate regulator 45a described above are provided in the mixed-solution supply line 160. Thus, the mixed-solution supply part 60 can supply the mixed solution M having a mixing ratio set by a user to the processing unit 16.

Further, as described above, the sulfuric acid supply part 100 is provided with the heater 107. In the mixing part 140, the temperature of the mixed solution M rises due to the reaction between the sulfuric acid and the pure water. Thus, the mixed-solution supply part 60 of the present embodiment can raise the temperature of the mixed solution M to a desired temperature and can supply the mixed solution M to the processing unit 16.

For example, the mixed-solution supply part 60 raises the temperature of the concentrated sulfuric acid to about 120 degrees C. by using the heater 107 of the sulfuric acid supply part 100. Thus, the temperature of the mixed solution M can be raised to about 150 degrees C. in the mixing part 140.

Further, although not shown in FIG. 4, a valve or the like may be additionally provided in the circulation line 103 or the like.

In the present embodiment, the mixing part 140 includes a reaction suppression mechanism that suppresses the reaction between the sulfuric acid and the DIW. This makes it possible to suppress the occurrence of the sudden boiling reaction in the mixing part 140 when the etching process of the wafer W using the mixed solution M is completed.

Therefore, according to the present embodiment, the time for the sulfuric acid discharging process shown in FIG. 3B can be shortened. Therefore, it is possible to shorten the entire time for the process on the wafer W, and to reduce the consumption amount of the sulfuric acid.

<Details of Reaction Suppression Mechanism>

Figure 5:
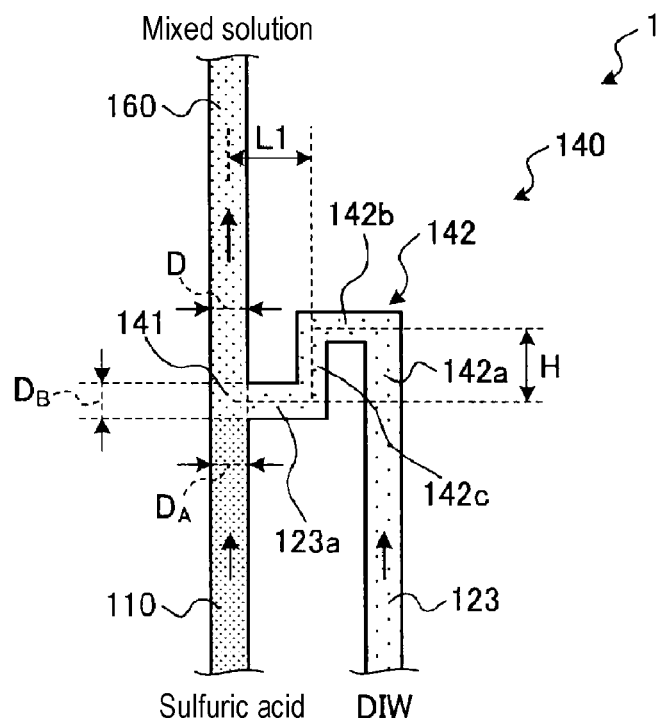
FIG. 5 is a view showing a configuration of a reaction suppression mechanism according to an embodiment.

Next, details of the reaction suppression mechanism provided in the mixing part 140 will be described with reference to FIGS. 5 to 7. FIG. 5 is a view showing a configuration of the reaction suppression mechanism according to the present embodiment.

As shown in FIG. 5, the mixing part 140 according to the present embodiment includes a joining portion 141 and a pipe buffer portion 142. The joining portion 141 is a portion where the sulfuric acid supply line 110 through which the temperature-raised sulfuric acid flows and the pure water supply line 123 through which the DIW flows are joined.

In the present disclosure, the joining portion 141 is not limited to the portion where the sulfuric acid supply line 110 and the pure water supply line 123 are joined, and may also include the vicinity of the joining portion. The pipe buffer portion 142 is a U-shaped portion provided in the vicinity of the joining portion 141 in the pure water supply line 123.

In the present embodiment shown in FIG. 5, the reaction between the sulfuric acid and the DIW in the joining portion 141 can be suppressed by the pipe buffer portion 142. That is, the pipe buffer portion 142 provided in the pure water supply line 123 constitutes the reaction suppression mechanism according to the present embodiment.

A specific configuration will be described below. In the present embodiment, the sulfuric acid supply line 110 and the pure water supply line 123 are connected to the joining portion 141 in the upward direction so that the sulfuric acid and the DIW flow upward from the joining portion 141. Further, the mixed-solution supply line 160 allows the mixed solution M (see FIGS. 3A to 3C) to flow upward from the joining portion 141.

The pipe buffer portion 142 provided in the vicinity of the joining portion 141 includes an ascending portion 142a, a horizontal portion 142b and a descending portion 142c, which are arranged in the named order from the upstream side.

The ascending portion 142a is an upwardly-oriented portion in the pure water supply line 123 and provided at a position higher than the joining portion 141. The horizontal portion 142b is a portion connected to the ascending portion 142a and configured to allow the DIW to flow in a substantially horizontal direction. The descending portion 142c is a portion connected to the horizontal portion 142b and configured to allow the DIW to flow downward.

Further, the descending portion 142c is connected to a horizontal portion 123a which allows the DIW to flow in the substantially horizontal direction in the pure water supply line 123. The horizontal portion 123a is connected to the joining portion 141.

That is, the DIW flowing upward in the pure water supply line 123 is first changed in direction to flow downward in the pipe buffer portion 142, and finally reaches the joining portion 141 in the substantially horizontal direction.

Figure 6:
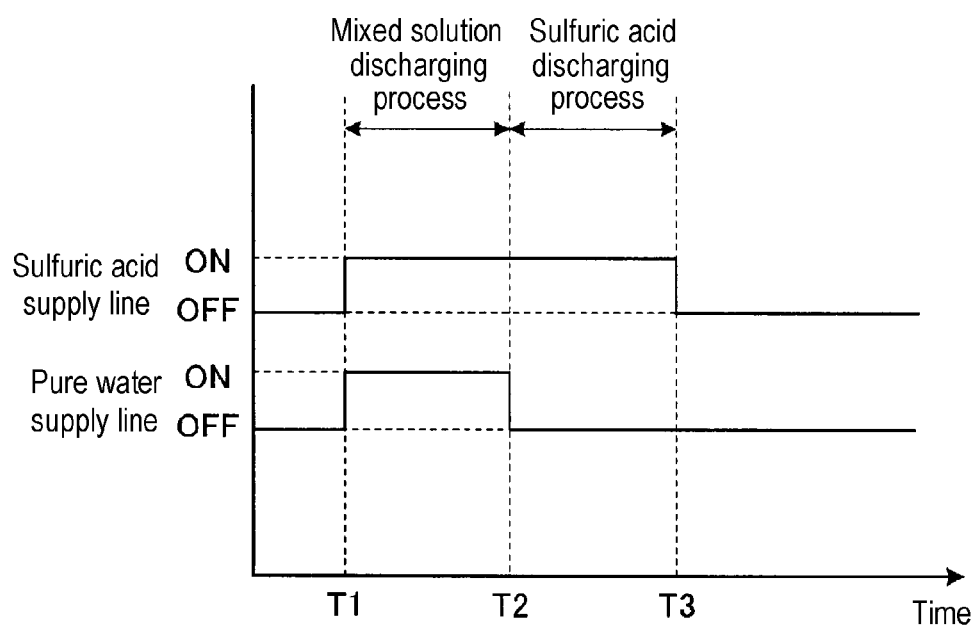
FIG. 6 is a timing chart showing a specific example of a behavior pattern of each part in the etching process according to the present embodiment.

FIG. 6 is a timing chart showing a specific example of a behavior pattern of each part in the etching process according to the present embodiment. First, the controller 18 executes the mixed-solution discharging process shown in FIG. 3A.

Specifically, the controller 18 starts supplying the sulfuric acid from the sulfuric acid supply line 110 to the mixing part 140 at time T1 (the sulfuric acid supply line: ON), and starts supplying the DIW from the pure water supply line 123 to the mixing part 140 (the pure water supply line: ON).

With this configuration, the mixed solution M is generated in the mixing part 140, whereby the controller 18 can cause the nozzle 41a to discharge the mixed solution M (see FIG. 4). Then, the controller 18 continuously executes the mixed-solution discharging process until a predetermined time T2.

Subsequently, the controller 18 executes the sulfuric acid discharging process shown in FIG. 3B. Specifically, the controller 18 stops the supply of the DIW from the pure water supply line 123 to the mixing part 140 at time T2 (the pure water supply line: OFF).

Thus, the flow of the DIW in the vicinity of the joining portion 141 is stopped, whereby the sulfuric acid flows back from the joining portion 141 to the pure water supply line 123, and the sulfuric acid and the DIW react with each other in the pure water supply line 123. As a result, after time T2, a sudden boiling reaction occurs in the pure water supply line 123 near the joining portion 141.

Therefore, the controller 18 executes the sulfuric acid discharging process until time T3 at which the sudden boiling reaction is settled. Finally, the controller 18 stops the supply of the sulfuric acid from the sulfuric acid supply line 110 to the mixing part 140 at time T3 (the sulfuric acid supply line: OFF), opens the valve 115 (see FIG. 4), and performs a liquid drainage process of draining the sulfuric acid remaining in the nozzle 41a. As a result, the sulfuric acid discharging process according to the present embodiment is completed.

In the present embodiment, the mixing part 140 includes the pipe buffer portion 142. Therefore, bubbles generated by the sudden boiling reaction are stored in the descending portion 142c after time T2. Then, in the present embodiment, a backward flow of the sulfuric acid to the upstream side can be prevented by the bubbles stored in the descending portion 142c.

That is, in the present embodiment, by providing the mixing part 140 with the pipe buffer portion 142, it is possible to prevent the sulfuric acid from flowing backward to the pure water supply line 123 when the etching process is completed. Therefore, according to the present embodiment, it is possible to suppress the occurrence of the sudden boiling reaction in the mixing part 140 when the etching process using the mixed solution M is completed.

Figure 7:
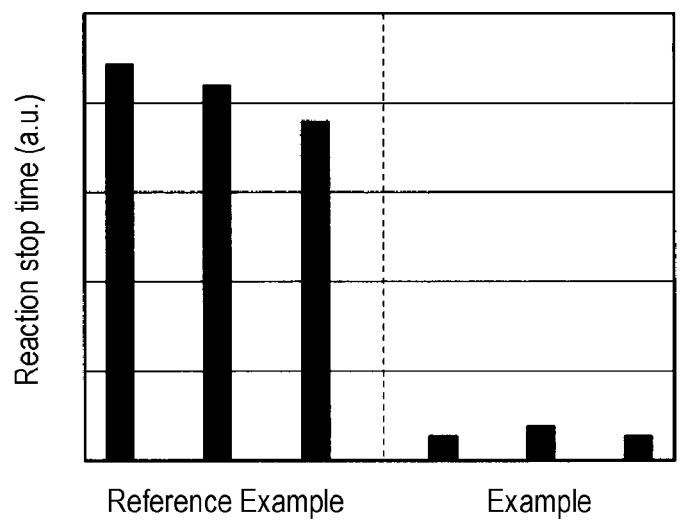
FIG. 7 is a view showing a reaction stop time in an Example and a Reference Example.

FIG. 7 is a view showing a reaction stop time in an Example and a Reference Example. The Example shown in FIG. 7 is directed to a case where the pipe buffer portion 142 is provided in the mixing part 140, and the Reference Example is directed to a case where the pipe buffer portion 142 is not provided in the mixing part 140.

As shown in FIG. 7, in the present embodiment, the stop time of the sudden boiling reaction can be shortened by providing the pipe buffer portion 142 in the mixing part 140.

Further, in the present embodiment, it is preferable that the uppermost portion of the pipe buffer portion 142 (the horizontal portion 142b in the example of FIG. 5) is positioned higher than the joining portion 141. Thus, it is possible to prevent the sulfuric acid having a specific gravity larger than that of the DIW from flowing backward from the joining portion 141 to the uppermost portion (the horizontal portion 142b) of the pipe buffer portion 142.

Therefore, according to the present embodiment, it is possible to further suppress the occurrence of the sudden boiling reaction in the mixing part 140 when the etching process using the mixed solution M is completed.

Further, in the present embodiment, it is preferable that the uppermost portion of the pipe buffer portion 142 (the horizontal portion 142b in the example of FIG. 5) is positioned higher than the joining portion 141 by a diameter $D_B$ or more of the pure water supply line 123 in the joining portion 141. That is, if the height of the horizontal portion 142b with respect to the joining portion 141 is assumed to be H, it is preferable that H $D_B \times 1$.

As a result, the uppermost portion (the horizontal portion 142b) of the pipe buffer portion 142 can be surely provided at a position higher than the joining portion 141. Therefore, it is possible to further suppress the backward flow of the sulfuric acid to the uppermost portion of the pipe buffer portion 142.

Further, in the present embodiment, the pipe buffer portion 142 may be spaced apart from the mixed-solution supply line 160 by a diameter D or more of the mixed-solution supply line 160 at the joining portion 141. That is, if the distance between the pipe buffer portion 142 and the mixed-solution supply line 160 is assumed to be L1, it is preferable that L1$\geq$D$\times$1.

Thus, it is possible to prevent the pipe buffer portion 142 and the mixed-solution supply line 160 from being placed over each other.

Preferably, a distance L1 between the pipe buffer portion 142 and the mixed-solution supply line 160 may be as short as possible (for example, L1$\geq$D$\times$5). This makes it possible to shorten the distance of the backward flow of the sulfuric acid from the joining portion 141 (i.e., a length of the horizontal portion 123a). This further suppresses the occurrence of the sudden boiling reaction in the mixing part 140.

In the present embodiment, an angle between the sulfuric acid supply line 110 and the pure water supply line 123 at the joining portion 141 is not particularly limited, and may be an angle at which a height H of the horizontal portion 142b with respect to the joining portion 141 satisfies a specified dimension.

Further, in the present embodiment, the diameter D of the mixed-solution supply line 160 is not particularly limited, and may be appropriately set in conformity with the discharge flow rate of the mixed solution M required for the etching process of the wafer W.

Further, in the present embodiment, a diameter $D_A$ of the sulfuric acid supply line 110 at the joining portion 141 and the diameter $D_B$ of the pure water supply line 123 at the joining portion 141 are not particularly limited. In the present embodiment, the diameter $D_A$ and the diameter $D_B$ may be appropriately set in conformity with the discharge flow rates of the sulfuric acid and the DIW required for the etching process of the wafer W.

For example, when the mixing ratio of the sulfuric acid and the DIW is 2:1, $D_A$:$D_B$ may be 4 mm: 2 mm. Of course, $D_A$ may be equal to $D_B$ without being limited to the mixing ratio of the sulfuric acid and the DIW.

<Various Modifications>

Figure 8:
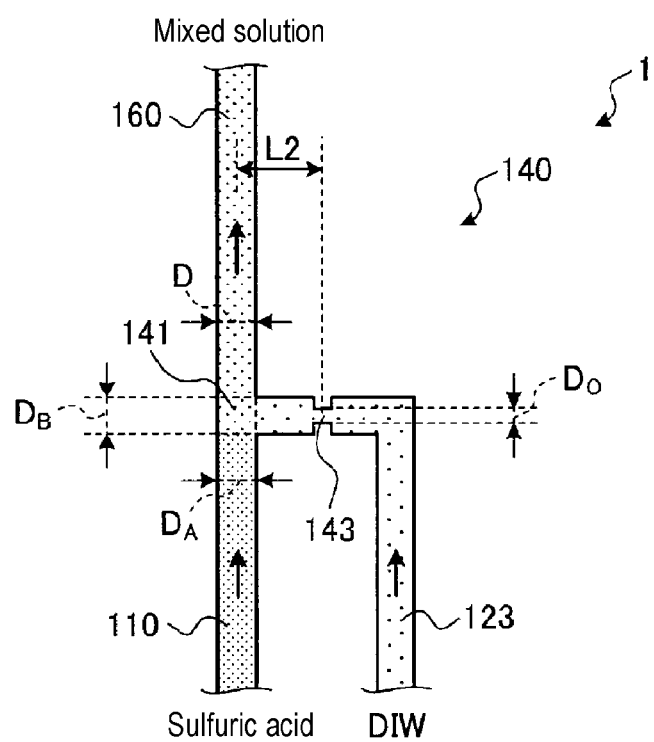
FIG. 8 is a view showing a configuration of a reaction suppression mechanism according to a first modification of the present embodiment.

Next, various modifications of the reaction suppression mechanism according to the present embodiment will be described with reference to FIGS. 8 to 18. FIG. 8 is a view showing a configuration of a reaction suppression mechanism according to a first modification of the present embodiment.

As shown in FIG. 8, a mixing part 140 according to the first modification includes a joining portion 141 and an orifice 143. The orifice 143 is another example of the reaction suppression mechanism, and is provided in the vicinity of the joining portion 141 in the pure water supply line 123.

In the first modification, the mixing part 140 is provided with the orifice 143. Therefore, it is possible to prevent the sulfuric acid from flowing backward to the pure water supply line 123 when the etching process is completed. Thus, according to the first modification, it is possible to suppress the occurrence of the sudden boiling reaction in the mixing part 140 when the etching process using the mixed solution M is completed.

Figure 9:
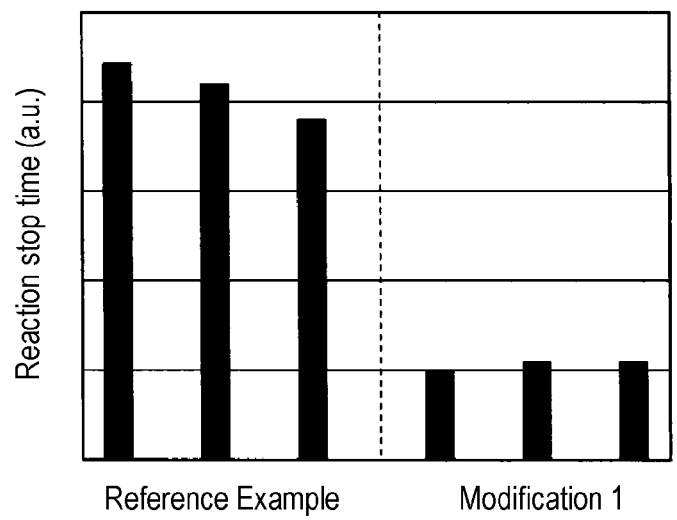
FIG. 9 is a view showing a reaction stop time in the first modification and a Reference Example.

FIG. 9 is a view showing a reaction stop time in the first modification and a Reference example. The first modification shown in FIG. 9 is directed to a case where the orifice 143 is provided in the mixing part 140, and the Reference Example is directed to a case where the orifice 143 is not provided in the mixing part 140.

As shown in FIG. 9, in the first modification, the stop time of the sudden boiling reaction can be shortened by providing the orifice 143 in the mixing part 140.

Further, in the first modification, an inner diameter $D_O$ of the orifice 143 is preferably ⅕ to ½ of the diameter $D_B$ of the pure water supply line 123 at the joining portion 141.

If the inner diameter $D_O$ of the orifice 143 is smaller than ⅕ of the diameter $D_B$ of the pure water supply line 123, there is a possibility that a sufficient amount of DIW cannot be supplied from the pure water supply line 123 to the joining portion 141. On the other hand, if the inner diameter $D_O$ of the orifice 143 is larger than ½ of the diameter $D_B$ of the pure water supply line 123, the backward flow of the sulfuric acid may not be sufficiently suppressed.

However, in the first modification, by setting the inner diameter $D_O$ of the orifice 143 in the range of ⅕ to ½ of the diameter $D_B$, a sufficient amount of DIW can be supplied to the joining portion 141 and the backward flow of the sulfuric acid can be sufficiently suppressed. In experimental results of the first modification shown in FIG. 9, the inner diameter $D_O$ of the orifice 143 was about ¼ of the diameter $D_B$.

Further, in the first modification, the orifice 143 may be spaced apart from the mixed-solution supply line 160 by the diameter D or more of the mixed-solution supply line 160 at the joining portion 141. That is, if a distance between the orifice 143 and the mixed-solution supply line 160 is assumed to be L2, it is preferable that L2$\geq$D$\times$1.

As a result, in the first modification, it is possible to prevent the orifice 143 and the mixed-solution supply line 160 from being placed over each other.

Preferably, the distance L2 between the orifice 143 and the mixed-solution supply line 160 may be as short as possible (for example, L2≥D×5). Thus, it is possible to shorten the backward flow distance of the sulfuric acid from the joining portion 141. This makes it possible to further suppress the sudden boiling reaction in the mixing part 140.

Further, in the first modification, the angle between the sulfuric acid supply line 110 and the pure water supply line 123 at the joining portion 141 is not particularly limited. In the first modification, for example, by connecting the pure water supply line 123 downward with respect to the joining portion 141, the sulfuric acid having a specific gravity larger than that of the DIW can be suppressed from flowing backward from the joining portion 141 to the pure water supply line 123.

Therefore, according to the first modification, it is possible to further suppress the occurrence of the sudden boiling reaction in the mixing part 140 when the etching process using the mixed solution M is completed.

Further, in the first modification, the diameter D of the mixed-solution supply line 160 is not particularly limited, and may be appropriately set in conformity with the discharge flow rate of the mixed solution M required for the etching process of the wafer W.

Further, in the first modification, the diameter $D_A$ of the sulfuric acid supply line 110 at the joining portion 141 and the diameter $D_B$ of the pure water supply line 123 at the joining portion 141 are not particularly limited. In the first modification, the diameter $D_A$ and the diameter $D_B$ may be appropriately set in conformity with the discharge flow rates of the sulfuric acid and the DIW required for the etching process of the wafer W.

Figure 10:
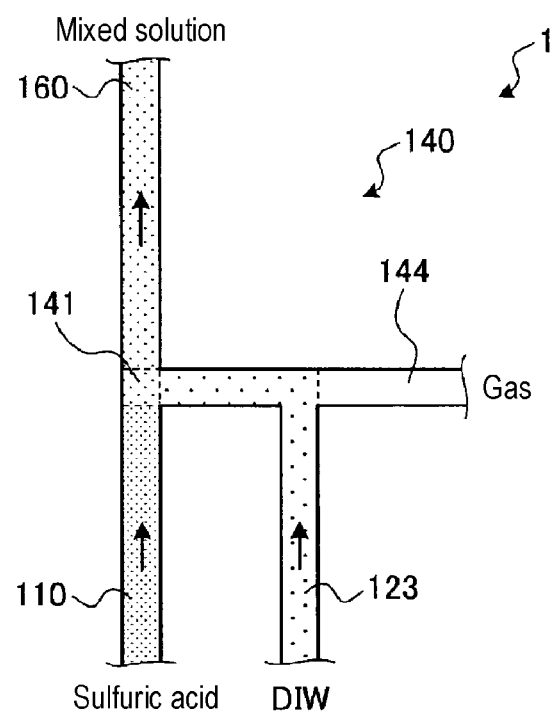
FIG. 10 is a view showing a configuration of a reaction suppression mechanism according to a second modification of the present embodiment.

FIG. 10 is a view showing a configuration of a reaction suppression mechanism according to a second modification of the present embodiment. As shown in FIG. 10, a mixing part 140 according to the second modification includes a joining portion 141 and a gas replacement portion 144. The gas replacement portion 144 is another example of the reaction suppression mechanism, and is connected to the pure water supply line 123 in the vicinity of the joining portion 141. The operation of the gas replacement portion 144 will be described below.

Figure 11:
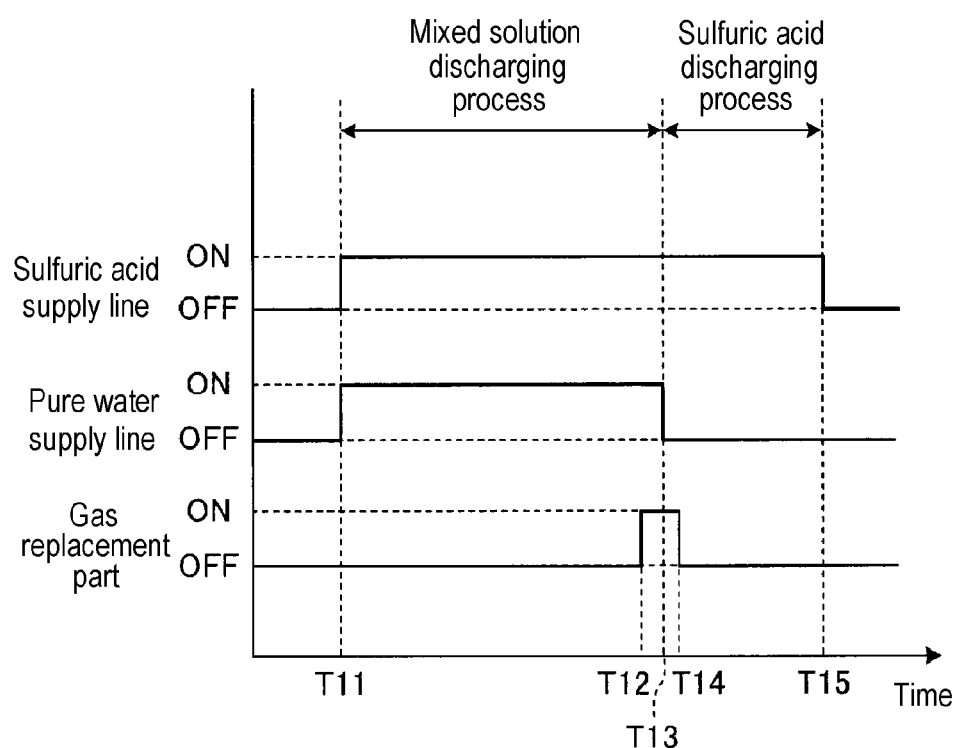
FIG. 11 is a timing chart showing a specific example of a behavior pattern of each part in an etching process according to the second modification of the present embodiment.

FIG. 11 is a timing chart showing a specific example of a behavior pattern of each part in an etching process according to the second modification of the present embodiment. First, the controller 18 executes the mixed-solution discharging process shown in FIG. 3A.

Specifically, at time T11, the controller 18 starts supplying the sulfuric acid from the sulfuric acid supply line 110 to the mixing part 140, and starts supplying the DIW from the pure water supply line 123 to the mixing part 140.

As a result, the mixed solution M is generated in the mixing part 140. Thus, the controller 18 can cause the nozzle 41a (see FIG. 4) to discharge the mixed solution M. Then, the controller 18 continuously executes the mixed-solution discharging process until a predetermined time T13.

Further, the controller 18 operates the gas replacement portion 144 during the time period from time T12 immediately before the completion of the mixed-solution discharging process to time T14 immediately after the completion of the mixed-solution discharging process (the gas replacement portion: ON).

Figure 12:
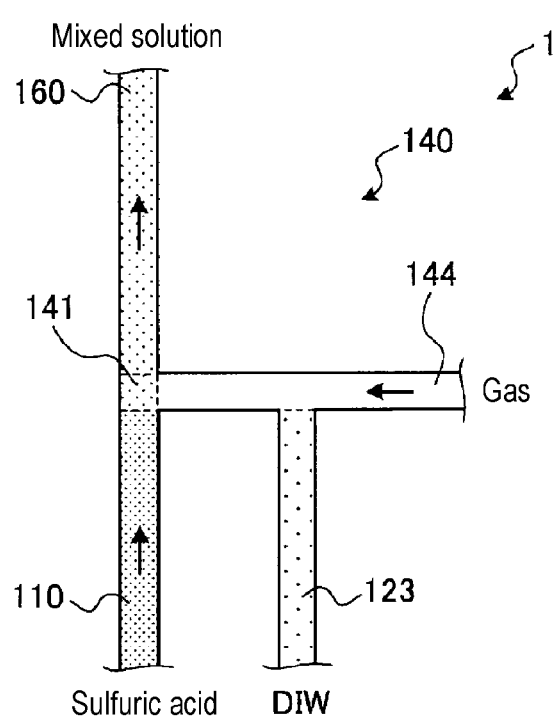
FIG. 12 is a view for explaining an operation of the reaction suppression mechanism according to the second modification of the present embodiment.

Thus, as shown in FIG. 12, the portion of the pure water supply line 123 in the vicinity of the joining portion 141 is replaced by a gas, whereby the backward flow of the sulfuric acid to the pure water supply line 123 can be blocked by the gas. FIG. 12 is a view for explaining the operation of the reaction suppression mechanism according to the second modification of the present embodiment.

That is, in the second modification, it is possible to prevent the sulfuric acid from flowing backward to the pure water supply line 123 when the etching process is completed. Therefore, according to the second modification, it is possible to suppress the occurrence of the sudden boiling reaction in the mixing part 140 when the etching process using the mixed solution M is completed.

In the second modification, the gas supplied from the gas replacement portion 144 to the pure water supply line 123 may preferably be a gas having low reactivity with the sulfuric acid or the DIW, such as a nitrogen gas or a dry air.

As shown in FIG. 11, the controller 18 executes a sulfuric acid discharging process during the time period from time T13 when the mixed-solution discharging process is completed to time T15 when the sudden boiling reaction is settled. Then, the controller 18 stops the supply of the sulfuric acid from the sulfuric acid supply line 110 to the mixing part 140 at time T15, opens the valve 115 (see FIG. 4), and performs a liquid drainage process of draining the sulfuric acid remaining in the nozzle 41a. In this way, the sulfuric acid discharging process according to the second modification is completed.

Figure 13:
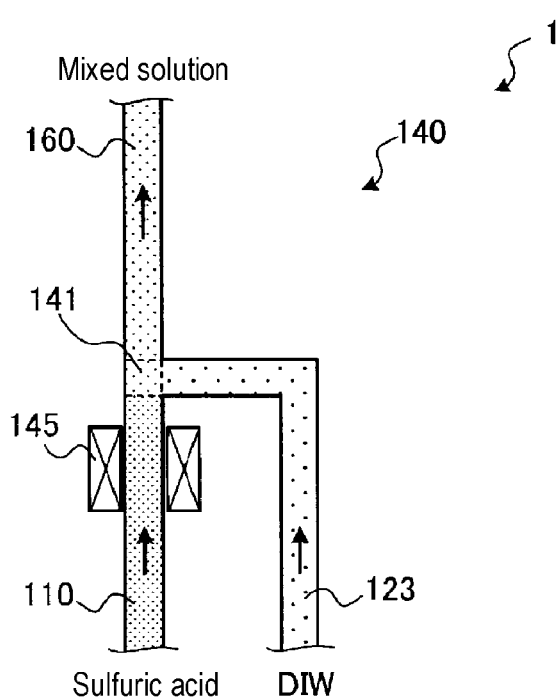
FIG. 13 is a view showing a configuration of a reaction suppression mechanism according to a third modification of the present embodiment.

FIG. 13 is a view showing a configuration of a reaction suppression mechanism according to a third modification of the present embodiment. As shown in FIG. 13, a mixing part 140 according to the third modification includes a joining portion 141 and a cooling part 145. The cooling part 145 is another example of the reaction suppression mechanism, and is installed in the sulfuric acid supply line 110 in the vicinity of the joining portion 141. The operation of the cooling part 145 will be described below.

Figure 14:
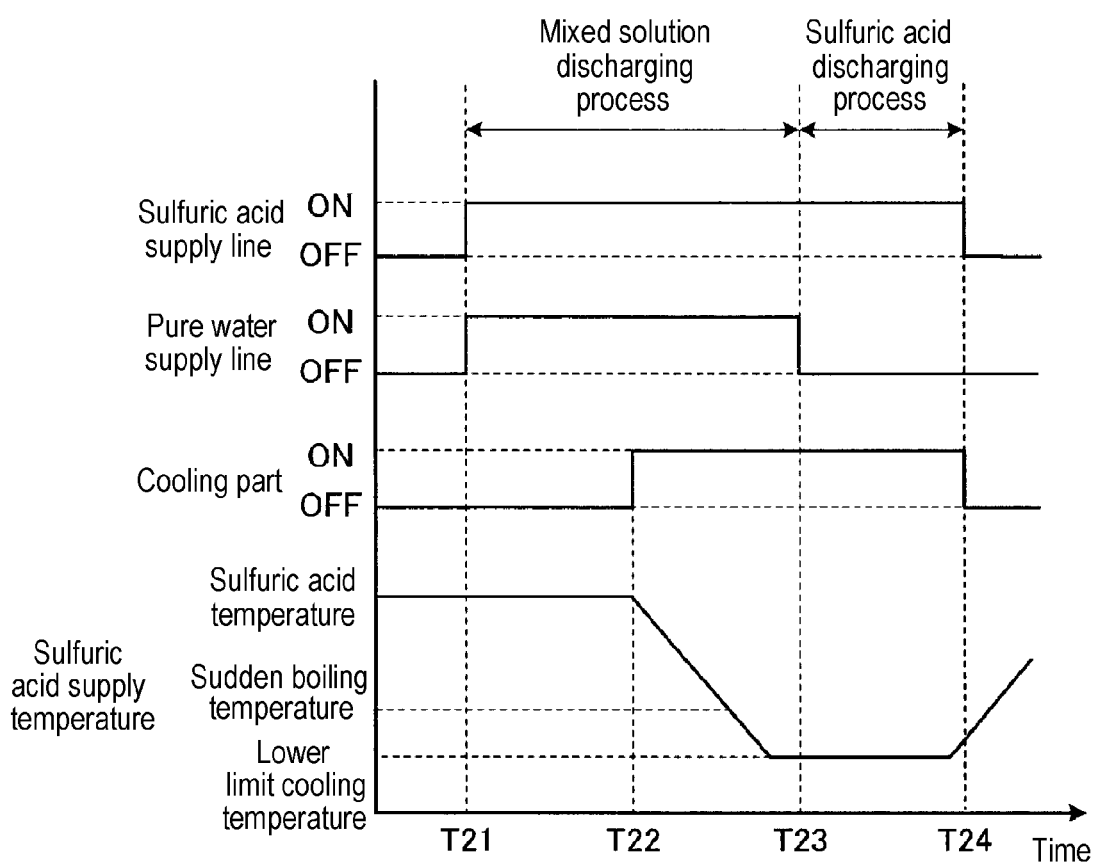
FIG. 14 is a timing chart showing a specific example of a behavior pattern of each part in an etching process according to the third modification of the present embodiment.

FIG. 14 is a timing chart showing a specific example of a behavior pattern of each part in an etching process according to the third modification of the present embodiment. First, the controller 18 executes the mixed-solution discharging process shown in FIG. 3A.

Specifically, at time T21, the controller 18 starts supplying the sulfuric acid from the sulfuric acid supply line 110 to the mixing part 140, and starts supplying the DIW from the pure water supply line 123 to the mixing part 140.

As a result, the mixed solution M is generated in the mixing part 140. Thus, the controller 18 can cause the nozzle 41a (see FIG. 4) to discharge the mixed solution M. Then, the controller 18 continuously executes the mixed-solution discharging process until a predetermined time T23.

Further, the controller 18 operates the cooling part 145 during the time period from time T22 immediately before the completion of the mixed-solution discharging process to time T24 immediately before the completion of the sulfuric acid discharging process (the cooling part: ON).

Thus, as shown in FIG. 14, the temperature of the sulfuric acid supplied to the joining portion 141 is reduced from a predetermined sulfuric acid supply temperature to a lower limit cooling temperature via a sudden boiling temperature. Then, the controller 18 terminates the mixed-solution discharging process after the temperature of the sulfuric acid supplied to the joining portion 141 is reduced to the lower limit cooling temperature.

Thus, even if the sulfuric acid and the DIW react with each other in the joining portion 141, it is possible to suppress the rising of the temperature to the sudden boiling temperature during the reaction. Therefore, according to the third modification, it is possible to suppress the occurrence of the sudden boiling reaction in the mixing part 140 when the etching process using the mixed solution M is completed.

As shown in FIG. 14, the controller 18 executes the sulfuric acid discharging process during the time period from time T23 at which the temperature of the sulfuric acid is equal to or near the lower limit cooling temperature, to time T24. Then, at time T24, the controller 18 stops the supply of the sulfuric acid from the sulfuric acid supply line 110 to the mixing part 140, and also stops the operation of the cooling part 145 (the cooling part: OFF).

Further, at time 24, the controller 18 opens the valve 115 (see FIG. 4), and performs a liquid drainage process of draining the sulfuric acid remaining in the nozzle 41a. In this way, the sulfuric acid discharging process according to the third modification is completed.

Figure 15:
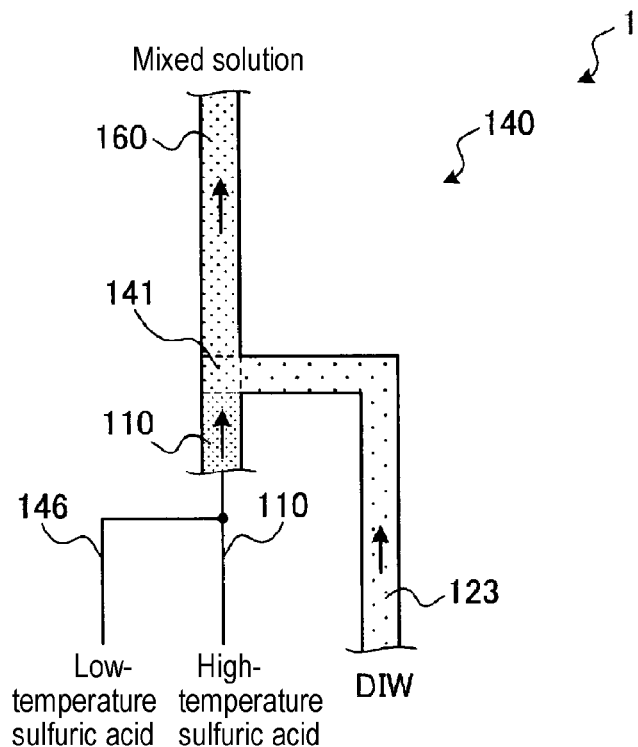
FIG. 15 is a view showing a configuration of a reaction suppression mechanism according to a fourth modification of the present embodiment.

FIG. 15 is a view showing a configuration of a reaction suppression mechanism according to a fourth modification of the present embodiment. As shown in FIG. 15, a mixing part 140 according to the fourth modification includes a joining portion 141 and a sulfuric acid replacement part 146. The sulfuric acid replacement part 146 is another example of the reaction suppression mechanism, and is connected to the sulfuric acid supply line 110 in the vicinity of the joining portion 141.

The sulfuric acid replacement part 146 supplies to the joining portion 141, the sulfuric acid (hereinafter also referred to as low-temperature sulfuric acid), which has a temperature (e.g., room temperature) lower than that of the sulfuric acid (hereinafter also referred to as high-temperature sulfuric acid) heated in the sulfuric acid supply part 100, so as to replace the high-temperature sulfuric acid remaining in the joining portion 141 with the low-temperature sulfuric acid. The operation of the sulfuric acid replacement part 146 will be described below.

Figure 16:
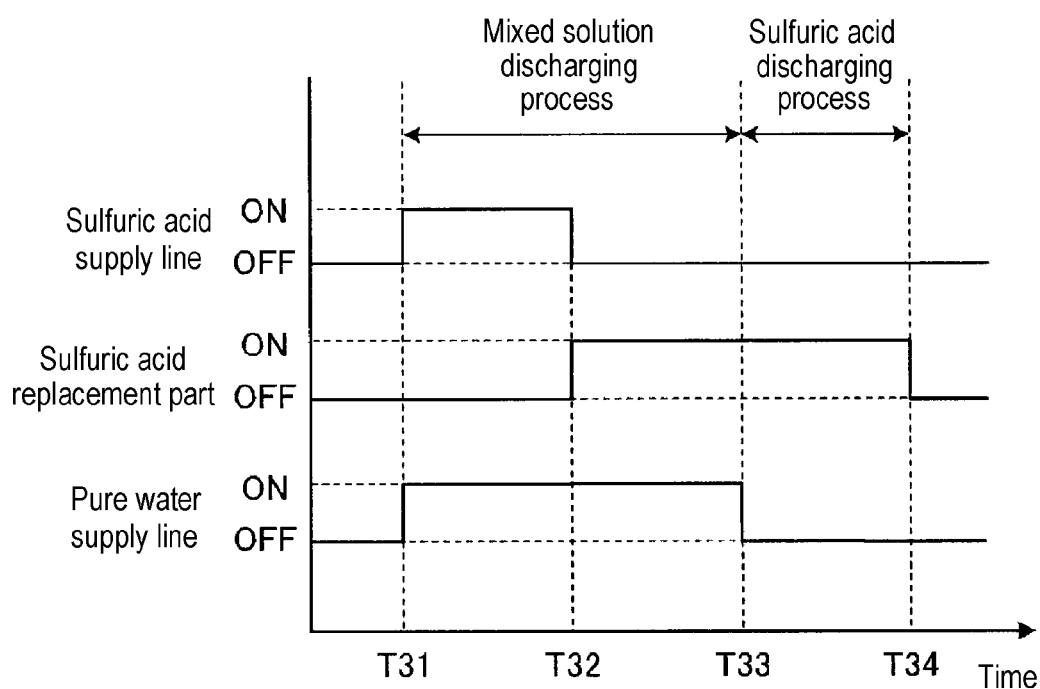
FIG. 16 is a timing chart showing a specific example of a behavior pattern of each part in an etching process according to the fourth modification of the present embodiment.

FIG. 16 is a timing chart showing a specific example of a behavior pattern of each part in an etching process according to the fourth modification of the present embodiment. First, the controller 18 executes the mixed-solution discharging process shown in FIG. 3A.

Specifically, at time T31, the controller 18 starts supplying the high-temperature sulfuric acid from the sulfuric acid supply line 110 to the mixing part 140, and starts supplying the DIW from the pure water supply line 123 to the mixing part 140.

As a result, the mixed solution M is generated in the mixing part 140. Thus, the controller 18 can cause the nozzle 41a (see FIG. 4) to discharge the mixed solution M. Then, the controller 18 continuously executes the mixed-solution discharging process until a predetermined time T32.

Next, at time T32, the controller 18 stops the supply of the high-temperature sulfuric acid from the sulfuric acid supply line 110 to the mixing part 140, and starts the supply of the low-temperature sulfuric acid from the sulfuric acid replacement part 146 to the mixing part 140 (the sulfuric acid replacement part: ON).

Thus, the high-temperature sulfuric acid in the joining portion 141 is replaced with the low-temperature sulfuric acid. Therefore, even if the low-temperature sulfuric acid reacts with the DIW at the joining portion 141, it is possible to suppress the temperature from rising to the sudden boiling temperature during the reaction. Thus, according to the fourth modification, it is possible to suppress the occurrence of the sudden boiling reaction in the mixing part 140 when the etching process using the mixed solution M is completed.

As shown in FIG. 16, the controller 18 stops the supply of the DIW from the pure water supply line 123 to the mixing part 140 at time T33 when the high-temperature sulfuric acid in the joining portion 141 is sufficiently replaced with the low-temperature sulfuric acid.

Then, at a predetermined time T34, the controller 18 stops the supply of the low-temperature sulfuric acid from the sulfuric acid replacement part 146 to the mixing part 140 (the sulfuric acid replacement part: OFF), opens the valve 115 (see FIG. 4), and executes a liquid drainage process of draining the sulfuric acid remaining in the nozzle 41a. In this way, the sulfuric acid discharging process according to the fourth modification is completed.

Figure 17:
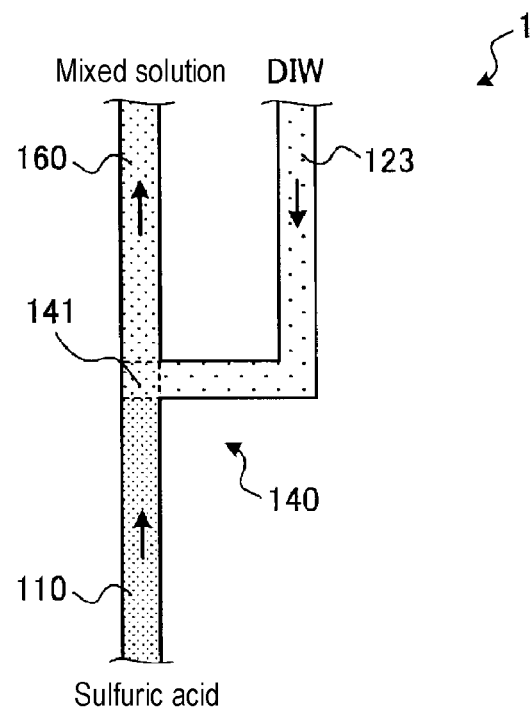
FIG. 17 is a view showing a configuration of a reaction suppression mechanism according to a fifth modification of the present embodiment.

FIG. 17 is a view showing a configuration of a reaction suppression mechanism according to a fifth modification of the present embodiment. As shown in FIG. 17, in a mixing part 140 of the fifth modification, the DIW flows downward with respect to the joining portion 141.

In the fifth modification, the sulfuric acid flowing upward with respect to the joining portion 141 and the DIW flowing downward with respect to the joining portion 141 are joined at the joining portion 141 to generate a mixed solution M at the joining portion 140.

In the fifth modification, the pure water supply line 123 is provided at a position higher than the joining portion 141 in the vicinity of the joining portion 141. Therefore, it is possible to suppress the backward flow of the sulfuric acid having a specific gravity larger than that of the DIW from the joining portion 141 to the pure water supply line 123.

Therefore, according to the fifth modification, it is possible to further suppress the occurrence of the sudden boiling reaction in the mixing part 140 when the etching process using the mixed solution M is completed.

In the example of FIG. 17, the DIW flowing downward with respect to the joining portion 141 is joined with the sulfuric acid flowing upward with respect to the joining portion 141. However, the flow direction of the sulfuric acid with which the DIW flowing downward is joined is not limited to upward.

Figure 18:
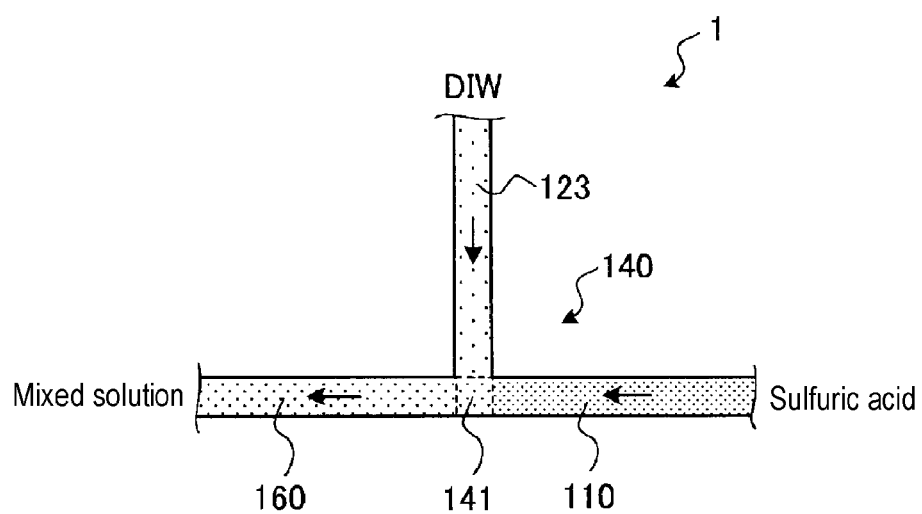
FIG. 18 is a view showing a configuration of a reaction suppression mechanism according to a sixth modification of the present embodiment.

For example, as shown in FIG. 18, the sulfuric acid flowing substantially horizontally with respect to the joining portion 141 and the DIW flowing downward with respect to the joining portion 141 may be joined at the joining portion 141 to generate the mixed solution M at the joining portion 140. FIG. 18 is a view showing a configuration of a reaction suppression mechanism according to a sixth modification of the present embodiment.

Also in the sixth modification, the pure water supply line 123 is provided at a position higher than the joining portion 141 in the vicinity of the joining portion 141. Therefore, it is possible to suppress the backward flow of the sulfuric acid having a specific gravity larger than that of DIW from the joining portion 141 to the pure water supply line 123.

Therefore, according to the sixth modification, it is possible to further suppress the occurrence of the sudden boiling reaction in the mixing part 140 when the etching process using the mixed solution M is completed.

In each of the embodiments described thus far, the DIW has been described to be used as the liquid that constitutes the mixed solution M together with the sulfuric acid. However, the liquid that constitutes the mixed solution M together with the sulfuric acid is not limited to the pure water.

For example, in each embodiment, a hydrogen peroxide solution may be used as the liquid that constitutes the mixed solution M together with the sulfuric acid. That is, in an embodiment, the mixed solution M may be composed of the sulfuric acid and the hydrogen peroxide solution (moisture+ hydrogen peroxide). Alternatively, the mixed solution M may be composed of the sulfuric acid, the hydrogen peroxide solution and various additives.

Further, in an embodiment, functional water (e.g., ozone water or hydrogen water) may be used as the liquid that constitutes the mixed solution M together with the sulfuric acid. That is, in an embodiment, the mixed solution M may be composed of the sulfuric acid and the ozone water (water+ozone), the mixed solution M may be composed of the sulfuric acid and hydrogen water (water+hydrogen)/ Alternatively, the mixed solution M may be composed of the sulfuric acid, the functional water and various additives.

As described above, when a substrate processing process is executed with the mixed solution M obtained by mixing various liquids containing moisture with the sulfuric acid, the temperature of the mixed solution M rises due to the reaction between the sulfuric acid and water during the generation of the mixed solution M. Therefore, when the etching process is completed, the mixed solution M may suddenly boil at the mixing part 140.

However, in each embodiment, the reaction suppression mechanism is provided in the mixing part 140 that mixes various liquids containing moisture with the sulfuric acid. Therefore, it is possible to prevent the mixed solution M from suddenly boiling in the mixing part 140 when the etching process is completed.

The substrate processing apparatus (the substrate processing system 1) according to the present embodiment includes the temperature raising part (the heater 107), the mixing part 140 and the discharging part (the nozzle 41a). The temperature raising part (the heater 107) raises the temperature of the sulfuric acid. The mixing part 140 mixes the temperature-raised sulfuric acid with the moisture-containing liquid to generate the mixed solution M. The discharging part (the nozzle 41a) discharges the mixed solution M onto the substrate (the wafer W) inside the substrate processing part 30. The mixing part 140 includes the joining portion 141 where the sulfuric acid supply line 110 through which the temperature-raised sulfuric acid flows and the liquid supply line (the pure water supply line 123) through which the liquid (DIW) flows are joined with each other, and the reaction suppression mechanism that suppresses the reaction between the temperature-raised sulfuric acid and the liquid (DIW) in the joining portion 141. Thus, it is possible to suppress the occurrence of the sudden boiling reaction in the mixing part 140 when the etching process using the mixed solution M is completed.

Further, in the substrate processing apparatus (the substrate processing system 1) according to the present embodiment, the reaction suppression mechanism includes the U-shaped pipe buffer portion 142 provided in the liquid supply line (the pure water supply line 123). Thus, it is possible to suppress the occurrence of the sudden boiling reaction in the mixing part 140 when the etching process using the mixed solution M is completed.

Further, in the substrate processing apparatus (the substrate processing system 1) according to the present embodiment, the uppermost portion of the pipe buffer portion 142 is provided at the position higher than the joining portion 141. Thus, it is possible to further suppress the occurrence of the sudden boiling reaction in the mixing part 140 when the etching process using the mixed solution M is completed.

Further, in the substrate processing apparatus (the substrate processing system 1) according to the present embodiment, the uppermost portion of the pipe buffer portion 142 is provided at the position higher than the joining portion 141 by the diameter $D_B$ or more of the pure water supply line 123 in the joining portion 141. Thus, it is possible to further suppress the backward flow of the sulfuric acid to the uppermost portion of the pipe buffer portion 142.

Further, in the substrate processing apparatus (the substrate processing system 1) according to the present embodiment, the pipe buffer portion 142 is spaced apart from the mixed-solution supply line 160, which supplies the mixed solution M from the joining portion 141 to the discharging part, by the diameter D or more of the mixed-solution supply line 160 at the joining portion 141. Thus, it is possible to prevent the pipe buffer portion 142 and the mixed-solution supply line 160 from being placed over each other.

Further, in the substrate processing apparatus (the substrate processing system 1) according to the present embodiment, the reaction suppression mechanism includes the orifice 143 provided in the liquid supply line (the pure water supply line 123). Thus, it is possible to suppress the occurrence of the sudden boiling reaction in the mixing part 140 when the etching process using the mixed solution M is completed.

Further, in the substrate processing apparatus (the substrate processing system 1) according to the present embodiment, the inner diameter $D_O$ of the orifice 143 is ⅕ to ½ of the diameter $D_B$ of the liquid supply line (the pure water supply line 123) at the joining portion 141. Thus, a sufficient amount of DIW can be supplied to the joining portion 141, and the backward flow of the sulfuric acid can be sufficiently suppressed.

Further, in the substrate processing apparatus (the substrate processing system 1) according to the present embodiment, the reaction suppression mechanism includes the gas replacement portion 144 that replaces the liquid in the liquid supply line (the pure water supply line 123) with a gas. Thus, it is possible to suppress the occurrence of the sudden boiling reaction in the mixing part 140 when the etching process using the mixed solution M is completed.

Further, in the substrate processing apparatus (the substrate processing system 1) according to the present embodiment, the reaction suppression mechanism includes the cooling part 145 that cools the temperature-raised sulfuric acid in the sulfuric acid supply line 110. Thus, it is possible to suppress the occurrence of the sudden boiling reaction in the mixing part 140 when the etching process using the mixed solution M is completed.

Further, in the substrate processing apparatus (the substrate processing system 1) according to the present embodiment, the reaction suppression mechanism includes the sulfuric acid replacement part 146 that replaces the sulfuric acid in the joining portion 141 with a sulfuric acid having a temperature lower than that of the temperature-raised sulfuric acid. Thus, it is possible to suppress the occurrence of the sudden boiling reaction in the mixing part 140 when the etching process using the mixed solution M is completed.

Further, in the substrate processing apparatus (the substrate processing system 1) according to the present embodiment, the liquid (DIW) flows downward with respect to the joining portion 141. Thus, it is possible to suppress the occurrence of the sudden boiling reaction in the mixing part 140 when the etching process using the mixed solution M is completed.

Further, in the substrate processing apparatus (the substrate processing system 1) according to the present embodiment, the liquid is pure water (DIW). Thus, among tungsten and titanium nitride contained in the film formed on the surface of the wafer W, the titanium nitride can be etched with high selectivity.

Further, in the substrate processing apparatus (the substrate processing system 1) according to the present embodiment, the liquid includes hydrogen peroxide solution. Thus, it is possible to efficiently etch the wafer W.

Further, in the substrate processing apparatus (the substrate processing system 1) according to the present embodiment, the liquid includes functional water. Thus, it is possible to efficiently etch the wafer W.

Although the present embodiments of the present disclosure have been described above, the present disclosure is not limited to the above-described embodiments. Various changes may be made without departing from the spirit thereof. For example, in the above-described embodiments, the technique is applicable not only to a step of etching one of the films formed on the substrate but also to a step of cleaning the substrate.

For example, when a tungsten film is formed on the substrate, the technique of the above-described embodiments is also applicable to a case of removing a residue after dry etching or a residue after a CMP (Chemical-Mechanical Polishing) process.

Further, in the above-described embodiments, there has been described the example in which the wafer W is etched with the mixed solution M and then rinsed. However, the process after the etching is not limited to the rinsing process, and may be any process.

According to the present disclosure in some embodiments, it is possible to suppress the occurrence of a sudden boiling reaction in a mixing part when an etching process using a mixed solution is completed.

It should be noted that the embodiments disclosed herein are exemplary in all respects and are not restrictive. The above-described embodiments may be omitted, replaced or modified in various forms without departing from the scope and spirit of the appended claims.

What is claimed is:

1. A substrate processing apparatus, comprising:
  a heater configured to raise a temperature of a sulfuric acid supplied from a sulfuric acid source;
  a sulfuric acid supply line configured to supply the sulfuric acid, whose temperature has been raised by the heater, to a mixing part;
  a liquid supply line configured to supply a moisture-containing liquid from a moisture-containing liquid source to the mixing part;
  the mixing part configured to mix the sulfuric acid from the sulfuric acid supply line with the moisture-containing liquid from the liquid supply line to generate a mixed solution; and
  a nozzle configured to discharge the mixed solution onto a substrate inside a substrate processing part,
  wherein the mixing part includes:
    a joining portion where the sulfuric acid supply line and the liquid supply line are joined; and
    a reaction suppression mechanism including a U-shaped pipe buffer portion, which is provided in the liquid supply line, and configured to suppress a reaction between the sulfuric acid, whose temperature has been raised by the heater, and the moisture-containing liquid in the joining portion, and
  wherein the U-shaped pipe buffer portion has an uppermost portion provided at a position higher than the joining portion.

2. The substrate processing apparatus of claim 1, wherein the uppermost portion of the U-shaped pipe buffer portion is provided at the position higher than the joining portion by a diameter or more of the liquid supply line in the joining portion.

3. The substrate processing apparatus of claim 1, wherein the U-shaped pipe buffer portion is spaced apart from a mixed-solution supply line, which supplies the mixed solution from the joining portion to the nozzle, by a diameter or more of the mixed-solution supply line in the joining portion.

4. The substrate processing apparatus of claim 1, wherein the moisture-containing liquid is a pure water.

5. The substrate processing apparatus of claim 1, wherein the moisture-containing liquid includes a hydrogen peroxide solution.

6. The substrate processing apparatus of claim 1, wherein the moisture-containing liquid includes a functional water.

* * * * *